United States Patent
Harada et al.

(10) Patent No.: US 8,093,853 B2
(45) Date of Patent: Jan. 10, 2012

(54) DEVICE-POSITIONING PEDESTAL AND HANDLER HAVING THE DEVICE-POSITIONING PEDESTAL

(75) Inventors: Keitaro Harada, Yamagata (JP); Masayoshi Yokoo, Yamagata (JP); Koichi Yoshida, Yamagata (JP); Norikazu Kainuma, Yamagata (JP)

(73) Assignee: Tohoku Seiki Industries, Ltd., Yamagata (JP)

( * ) Notice: Subject to any disclaimer, the term of this patent is extended or adjusted under 35 U.S.C. 154(b) by 866 days.

(21) Appl. No.: 11/988,347

(22) PCT Filed: Jul. 8, 2005

(86) PCT No.: PCT/JP2005/013102
§ 371 (c)(1),
(2), (4) Date: Jan. 3, 2008

(87) PCT Pub. No.: WO2007/007416
PCT Pub. Date: Jan. 18, 2007

(65) Prior Publication Data
US 2009/0206224 A1    Aug. 20, 2009

(51) Int. Cl.
*G05B 19/40*    (2006.01)
*B24B 49/00*    (2006.01)

(52) U.S. Cl. ........ 318/560; 318/561; 318/571; 318/685; 451/5; 451/11; 451/67; 700/275

(58) Field of Classification Search ............... 318/560, 318/561, 685, 571, 572, 41, 400.23; 451/5, 451/11, 67; 700/275
See application file for complete search history.

(56) References Cited

U.S. PATENT DOCUMENTS

| | | | | |
|---|---|---|---|---|
| 6,878,044 | B2 * | 4/2005 | Sakurai et al. | 451/67 |
| 7,437,831 | B2 * | 10/2008 | Hayashi et al. | 33/706 |
| 7,583,096 | B2 * | 9/2009 | Hosaka et al. | 324/755.11 |
| 7,586,284 | B2 * | 9/2009 | Akita | 318/685 |
| 7,759,893 | B2 * | 7/2010 | Akita | 318/567 |

(Continued)

FOREIGN PATENT DOCUMENTS
JP    10-123207    5/1998
(Continued)

OTHER PUBLICATIONS

Patent Abstracts of Japan, Publication No. 10-123207; Date of Publication: May 15, 1998; in the name of Toru Taura.

(Continued)

*Primary Examiner* — Paul Ip
(74) *Attorney, Agent, or Firm* — Christie, Parker & Hale, LLP.

(57) ABSTRACT

A device-positioning pedestal capable of positioning devices of different sizes. The device-positioning pedestal comprises a plurality of guide members corresponding to the sides of the device and coming in contact with the sides of the device to position the device, at least one guide member includes a slide mechanism that supports the guide member so as to slide relative to the device-positioning pedestal member and a fixing mechanism that fixes the guide members at desired positions. The guide members are set to be adapted to the size of the device by the guide member-adjusting means separate from the device-positioning pedestal. The guide member-adjusting means adjust the position of the guide members based on the size of the device measured by device size-measuring means separate from the guide member-adjusting means or based on the data of data-recording means attached to the device-positioning pedestal.

9 Claims, 11 Drawing Sheets

U.S. PATENT DOCUMENTS

| | | | |
|---|---|---|---|
| 2002/0140296 A1* | 10/2002 | Ebihara | 310/12 |
| 2004/0137823 A1* | 7/2004 | Sakurai et al. | 451/5 |
| 2005/0159082 A1* | 7/2005 | Sakurai et al. | 451/11 |
| 2007/0264104 A1* | 11/2007 | Hosaka et al. | 414/186 |
| 2008/0083123 A1* | 4/2008 | Hayashi et al. | 33/1 M |
| 2008/0315810 A1* | 12/2008 | Akita | 318/400.23 |
| 2009/0005910 A1* | 1/2009 | Akita | 700/275 |
| 2009/0267626 A1* | 10/2009 | Hosaka et al. | 324/754 |

FOREIGN PATENT DOCUMENTS

| | | |
|---|---|---|
| JP | 11-231019 | 8/1999 |
| JP | 2000-188363 | 7/2000 |
| JP | 2001-83207 | 3/2001 |
| JP | 2002-189057 | 7/2002 |
| JP | 2003-198193 | 7/2003 |

OTHER PUBLICATIONS

International Search Report, dated Oct. 25, 2005, corresponding to PCT/JP2005/013102.

Patent Abstracts of Japan, Publication No. 11231019 A, Published on Aug. 27, 1999, in the name of Hisatomi.

Patent Abstracts of Japan, Publication No. 2000188363 A, Published on Jul. 4, 2000, in the name of Tsuruoka.

Patent Abstracts of Japan, Publication No. 2001083207 A, Published on Mar. 30, 2001, in the name of Tokumiya, et al.

Patent Abstracts of Japan, Publication No. 2003198193 A, Published on Jul. 11, 2003, in the name of Okuizumi, et al.

Office action for corresponding Korean Patent Application No. 10-2008-7000264 dated Jun. 14, 2011, 5pp.

* cited by examiner

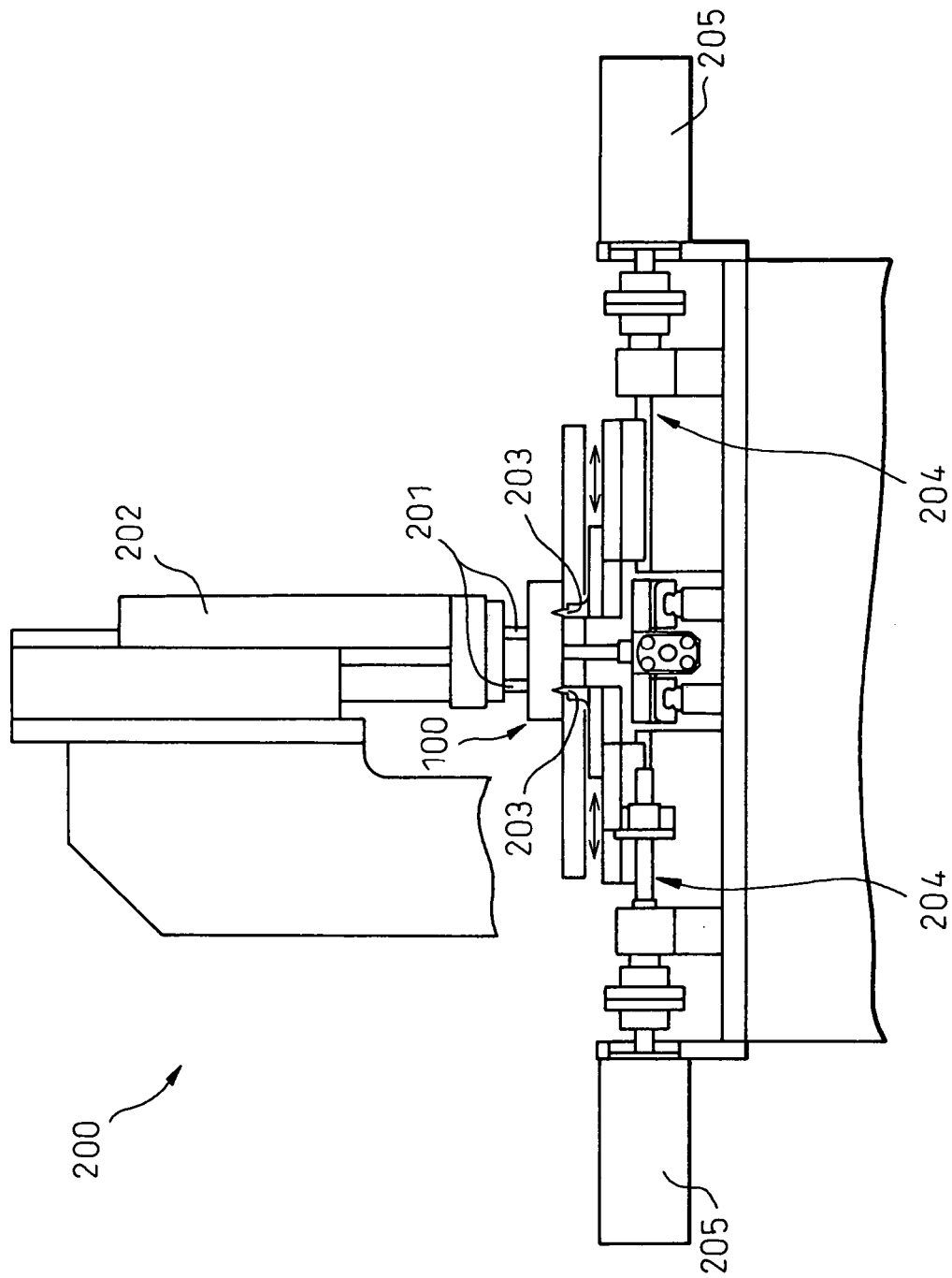

DEVICE-POSITIONING PEDESTAL AND HANDLER HAVING THE DEVICE-POSITIONING PEDESTAL

CROSS-REFERENCE TO RELATED APPLICATION

This application is a National Phase Patent Application and claims the priority of International Application Number PCT/JP2005/013102, filed on Jul. 8, 2005.

TECHNICAL FIELD

The present invention relates to a device-positioning pedestal for temporarily positioning a device at the time of testing an electronic part (hereinafter referred to as a device).

The invention further relates to a handler having the device-positioning pedestal for conducting the testing.

BACKGROUND ART

An apparatus known as a handler that includes an inspection device is used for testing the devices. The handler has, for example, an uninspected tray (container box) containing uninspected devices arranged on a loader portion in the handler, which transfers a predetermined number of uninspected devices from the uninspected tray to predetermined positions of the inspection device, elevates the temperature as required, and then transfers them onto IC sockets on, for example, an electronic part testing device (hereinafter referred to as a device tester), sorts the tested devices into acceptable devices (defective devices and devices to be tested again), and places them in container trays (see FIG. 1).

In transferring an uninspected device taken out from the uninspected tray onto the predetermined position of the inspection device, the device is first transferred by a feed robot from the uninspected tray onto a device-positioning pedestal. Thereafter, the device is transferred together with the device-positioning pedestal to a predetermined place of the inspection device. The device is then moved onto the IC socket on the device tester by using a clamper or the like. After testing by the device tester is finished, the device is then transferred from the IC socket to the device-positioning pedestal by using the clamper, etc., and is thereafter, moved from the device-positioning pedestal to a container or a sorting tray.

FIG. 11A is a top view of a device-positioning pedestal 100 that has been used, and FIG. 11B is a side sectional view thereof. A portion for holding device D of device-positioning pedestal 100 is not movable, and is not capable of coping with a change in the size of device D. Therefore, different device-positioning pedestals 100 must be provided for devices D of different sizes.

However, it is a modern trend to decrease the size of equipment and to highly densely mount the parts, and therefore, to decrease the sizes of devices and to use surface-mounted packages, such as CSP (chip size package), BGA (ball grid array), QFP (quad flat package) and the like, which are becoming smaller, thinner and lighter and having less lead pitches.

To insert the device from a rough positioning tray into an IC socket having a narrow pitch, the guide member of the device-positioning pedestal must be precise. Therefore, if the type and outer size of the device are changed even by a small amount, a new and exclusive device-positioning pedestal must be produced and used.

Even a slight change in the size makes it necessary to newly provide an exclusive device-positioning pedestal. Therefore, may expensive device-positioning pedestals must be provided. In conducting the testing in the handler, the device-positioning pedestal must be exchanged for each type of the device and for each size of the device. When a plurality of handlers are used, number of the device-positioning pedestals for exchange becomes very great, and a large space and maintenance thereof becomes necessary. Further, since the device-positioning pedestals must have high precision, even a slight difference in the size makes it necessary to produce the pedestal again.

Therefore, it has been desired to develop a device-positioning pedestal applicable to devices of different sizes.

JP-A-10-123207 discloses image processing of a device in a receiving portion of a device-positioning pedestal. This makes it possible to position devices of a plurality of sizes. However, a problem remains in that the image-processing apparatus excessive is expensive, and the image processing requires time causing a reduction in working efficiency.

DISCLOSURE OF THE INVENTION

Problems to be Solved by the Invention

In view of the above-mentioned problems, it is an object of the present invention to provide a device-positioning pedestal capable of positioning devices of a plurality of sizes without decreasing working efficiency. The invention, further, has an object of providing a handler having the device-positioning pedestal.

Means for Solving the Problem

The device-positioning pedestal of the invention comprises a plurality of guide members corresponding to the sides of a device and coming in contact with the sides of the device to position the device, wherein at least one guide member includes a slide mechanism that supports the guide member so as to slide relative to the device-positioning pedestal member and a fixing mechanism that fixes the guide member at a desired position, so as to hold the devices of a plurality of sizes.

According to one aspect of the invention, the device-positioning pedestal for holding a square device has guide members which are movable in relation to the four sides of a square.

According to one aspect of the invention, the fixing mechanism for fixing the guide members at desired positions includes pushing members that come in slide contact with the guide members via tilted surfaces, and the guide members are pushed onto the surfaces of the device-positioning pedestal member due to the wedge action of the tilted surfaces.

According to one aspect of the invention, the guide members are set to be fitted to the size of the device by guide member-adjusting means which are separate from the device-positioning pedestal.

Preferably, the guide members and the guide member-adjusting means are engaged together by engaging means that engage them together in a complementary manner.

Preferably, the guide member-adjusting means adjust the positions of the guide members based on the size of the device measured by device size-measuring means separate from the guide member-adjusting means.

Preferably, the device-positioning pedestal is provided with data-recording means, the data related to the device-positioning pedestal is recorded in the data-recording means by data read/write means separate from the device-positioning pedestal, the data recorded in the data-recording means are sent to the guide member-adjusting means, and the guide member-adjusting means adjust the positions of the guide members based on the data that are sent.

According to one aspect of the invention, a provision is made for a suction means for holding and pushing the device onto the device-positioning pedestal, the suction means includes a sucking force stabilizer for preventing change the sucking force by the suction means because of a change of the positions of the guide members.

Preferably, the sucking force stabilizer is constituted by an expansible material that expands and contracts depending upon the positions of the guide members or is constituted by a shutter blade that undergoes displacement depending upon the positions of the guide members.

According to one aspect of the invention, the device-positioning pedestal member is provided with a mounting mechanism which is mounted on an apparatus that uses the device-positioning pedestal, the mounting mechanism being the same as the mounting mechanism of the device-positioning pedestal having guide members that do not move, so as to be compatible with the device-positioning pedestal having guide members that do not move.

According to the present invention, there is also provided a handler including any one of the above device-positioning pedestals.

The guide member-adjusting means can be provided either on the inside of the handler or on the outside of the handler.

BRIEF DESCRIPTION OF THE DRAWINGS

FIG. 6 shows a guide motion-adjusting device arranged on the outside of the handler;

BEST MODE FOR CARRYING OUT THE INVENTION

An embodiment of the invention will now be described with reference to the drawings.

Figure 3A:
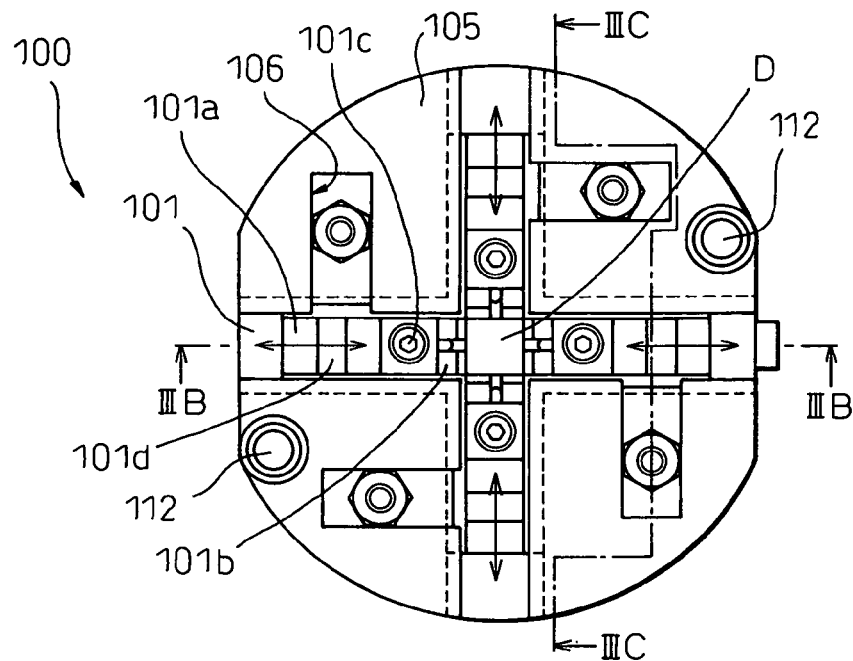
FIG. 3A is a top view of the device-positioning pedestal of the present invention.
Figure 3B:
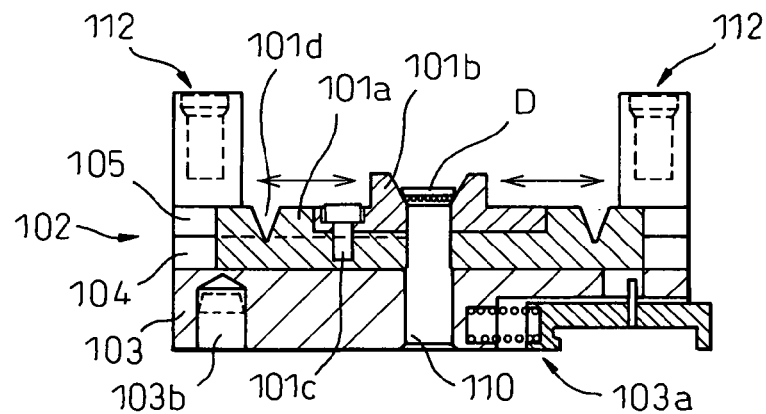
FIG. 3B is a sectional view along the line IIIB-IIIB of FIG. 3A.
Figure 3C:
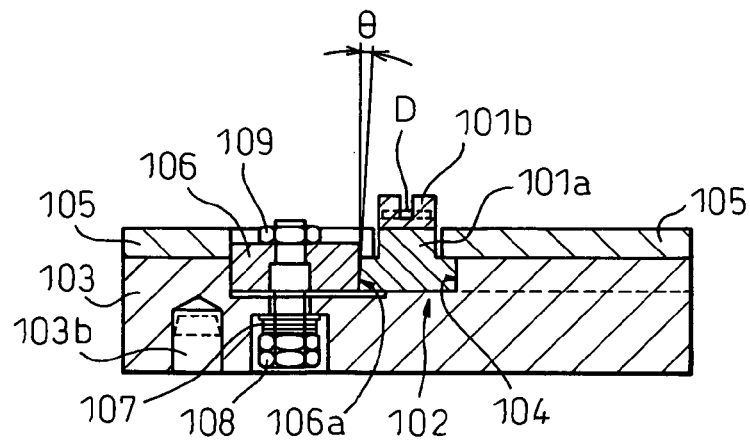
FIG. 3C is a sectional view along the line IIIC-IIIC of FIG. 3A.

FIG. 3A is a top view of a device-positioning pedestal 100 according to the present invention, FIG. 3B is a sectional view along the line IIIB-IIIB of FIG. 3A, and FIG. 3C is a sectional view along the line IIIC-IIIC of FIG. 3A.

Reference numeral 101 denotes a guide member. Guide members 101 are formed by fixing a guide element 101b to a guide base 101a by a bolt 101c. Guide base 101a and guide element 101b may be formed integrally together. A recessed groove 101d is formed in guide base 101a and extends at right angles in the lengthwise direction. In this embodiment, recessed groove 101d is a V-groove.

Guide member 101 has an inverse T-shape in cross section (see FIG. 3C), and slides in a groove 102 that has an inverse T-shape in cross section like guide member 101. Groove 102 of the inverse T-shape is formed by attaching a cover member 105 to a main member 103 of device-positioning pedestal 100 in which a groove 104 is formed having a rectangular shape in cross section, but forming a gap at the center.

Reference numeral 106 denotes a clamp block. Clamp block 106 is arranged by partly removing cover member 105 and main member 103. A surface 106a of clamp block 106 on the center side comes in contact with the side surface of guide base 101a of guide member 101, but the contact surface is tilted by only a very small angle θ.

Clamp block 106 is pushed onto the main member 103 by a bolt 108 and a nut 109 with a coned disc spring 107 interposed therebetween. The clamp block 106 is pushed downward due to the coned disk spring 107. The contact surface that is tilted as described above produces a wedge action, and clamp block 106 pushes guide base 101a of the guide member 101 onto the side surface of groove 104. As a result, the position of guide member 101 is fixed.

If the head of bolt 108 is pushed toward coned disc spring 107, no pushing force is produced by coned disc spring 107. Therefore, the guide member 101 is liberated and is allowed to move.

Referring to FIG. 3B, a hole 110 is formed in the center of main member 103 penetrating through in the vertical direction. Hole 110 is used as a suction hole for holding a device D by suction after the device D is placed thereon, and is further used as a guide hole for setting device-positioning pedestal 100.

Figure 11A:
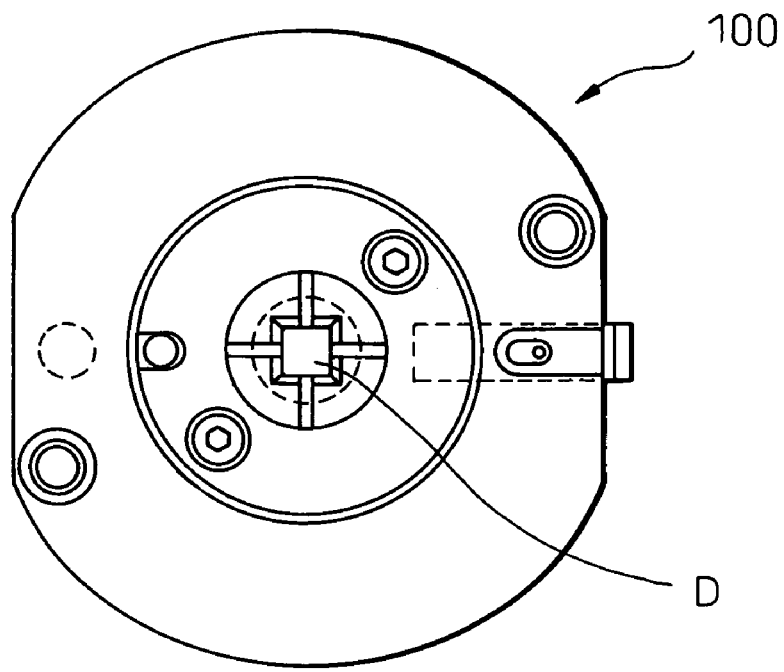
FIG. 11A is a top view of a device-positioning pedestal to which a conventional guide member is fixed.
Figure 11B:
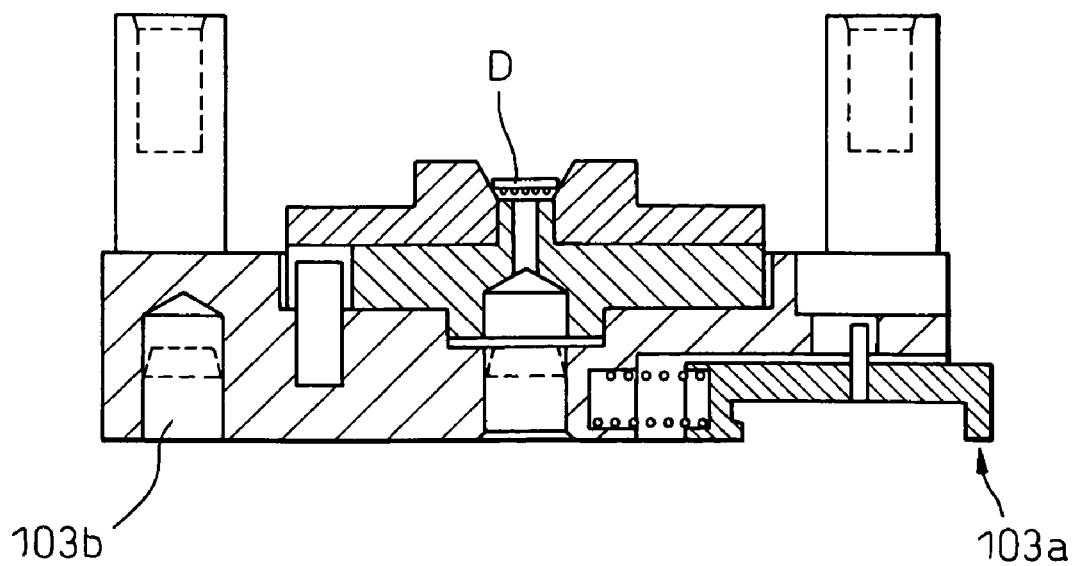
FIG. 11B is a sectional view along the line XIII-XIII of FIG. 11A.

In FIG. 3B, reference numeral 103a denotes a mounting mechanism used for setting device-positioning pedestal 100 to a handler 1 (see FIG. 1), and 103b denotes a guide hole for positioning. Mounting mechanism 103a and guide hole 103b are the same as those of a conventional device-positioning pedestal of which the guide member is not movable shown in FIGS. 11a and 11b. Therefore, device-positioning pedestal 100 of the present invention is compatible with the conventional device-positioning pedestal having a guide member which is not movable.

Figure 4A:
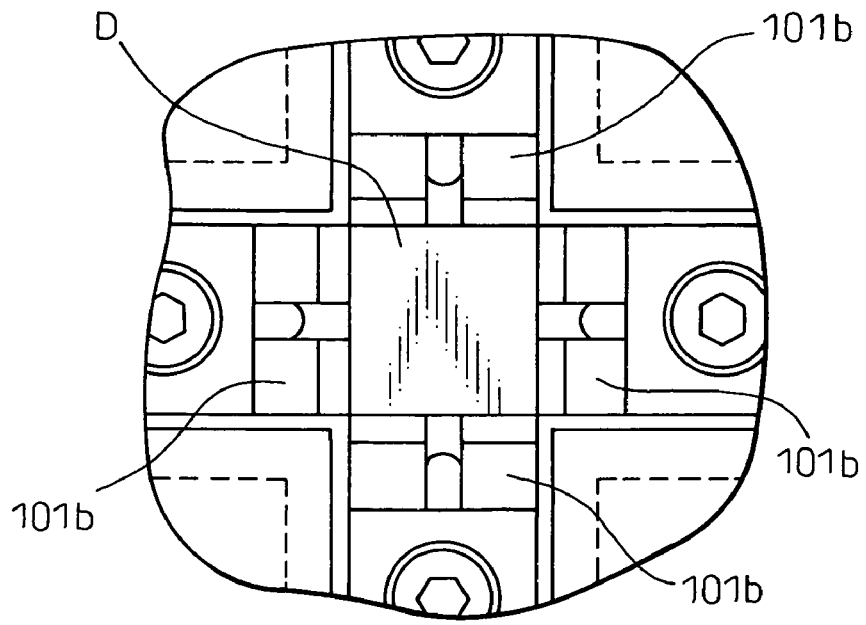
FIG. 4A is a top view of the device-positioning pedestal of when holding a small device.
Figure 4B:
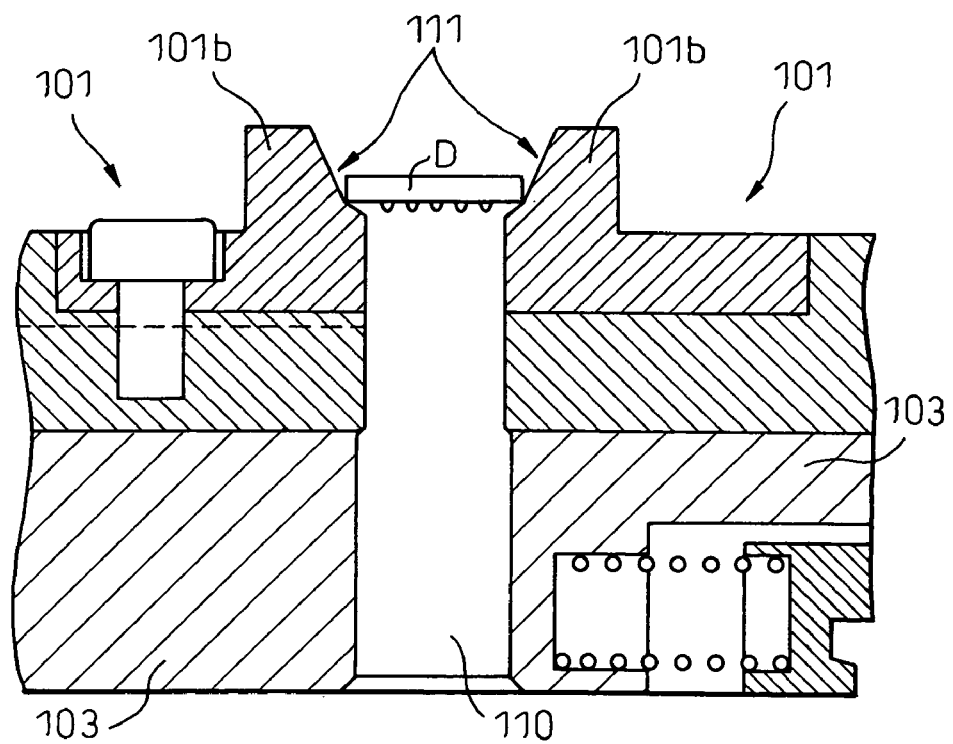
FIG. 4B is a side sectional view of the device-positioning pedestal of when holding the small device.

FIGS. 4A and 4B are a top view and a side view of device-positioning pedestal 100 holding a smallest device to be held. Referring to FIG. 4B, device-receiving surfaces 111 of guide elements 101b include sharply tilted surfaces on the upper side and mildly tilted surfaces on the lower side.

Figure 5A:
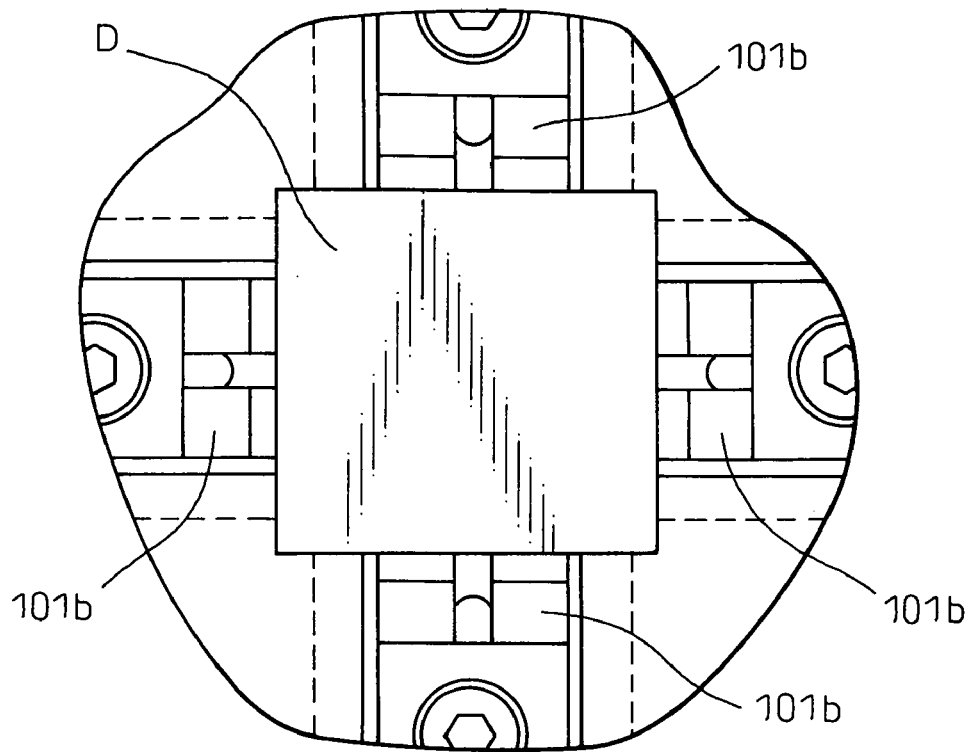
FIG. 5A is a top view of the device-positioning pedestal of when holding a large device.
Figure 5B:
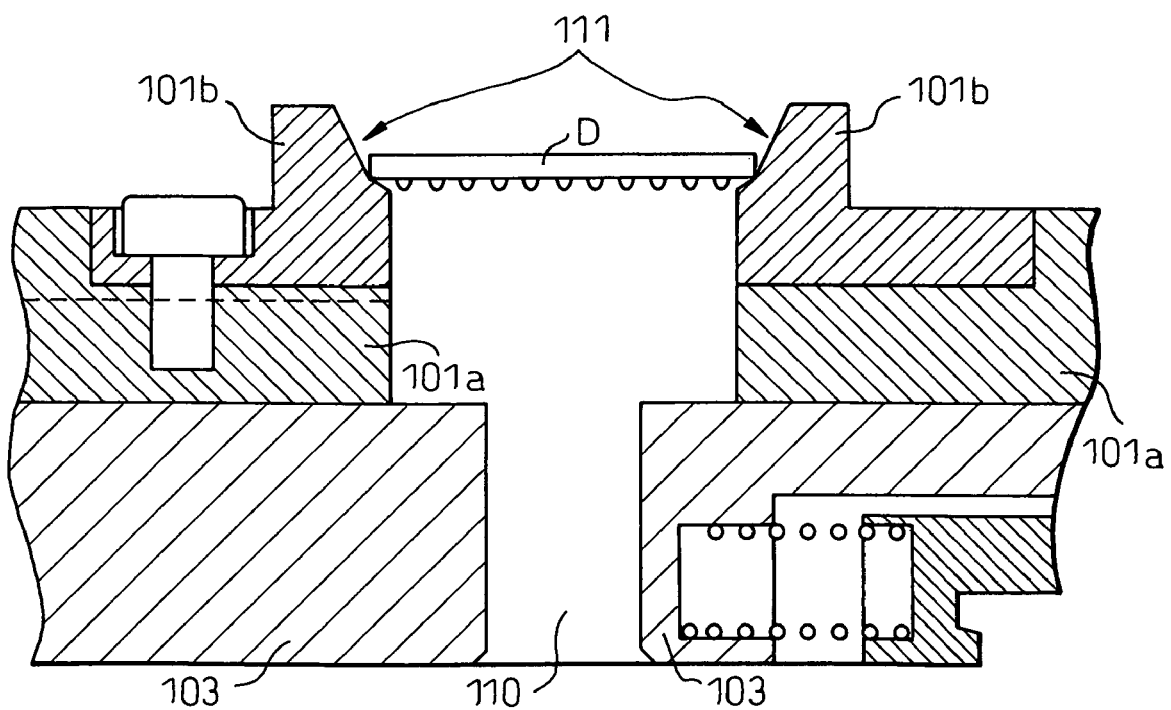
FIG. 5B is a side sectional view of the device-positioning pedestal of when holding the large device.

FIGS. 5A and 5B illustrate a state of device-positioning pedestal 100 of when holding a larger device D.

The greatest advantage and feature of the device-positioning pedestal of the present invention are that it is capable of supporting devices of different sizes.

Described below are how to move and fix guide member 101 so as to meet the size of the device. Namely, described below is a case where the operation for a device of a given size (device of the last time) is finished and a preparation is being made for the operation for a device having another size (device of this time).

First, as will be described later, device-positioning pedestal 100 is mounted on the handler or more closely, on a transversely moving plate 5. The mounting on, and the removal from transversely moving plate 5 are conducted by an operator by hand.

Device-positioning pedestal 100 that is removed is mounted on a guide motion-adjusting device 200 shown in FIG. 6. Guide motion-adjusting device 200 in this embodiment is provided on the outside of the handler 1 but may be provided on the inside of the handler 1.

In the case of diagramed guide motion-adjusting device 200, device-positioning pedestal 100 is turned upside down as shown, i.e., the side for receiving the device D is on the lower side to carry out the work. However, there is also a guide motion-adjusting device with which device-positioning pedestal 100 is not turned upside down but is mounted in a normal attitude.

In this case, guide pin receivers 112 (see FIGS. 3A and 3B) of device-positioning pedestal 100 are brought into engagement with the guide pins (not shown), and device-positioning pedestal 100 is set to guide motion-adjusting device 100 by means that is not shown.

Next, clamp release pins 201 are pushed down by an up-down drive device 202 that utilizes the pneumatic pressure or an electric motor, to push down a bolt 108 fixing clamp block 106 of the device-positioning pedestal 100 against the urging force of coned disc spring 107. As a result, no wedge action acts, the pushing force with which guide member 101 had been pushed onto the wall of groove 102 is released, and guide member 101 is allowed to move.

Here, if protuberances 203 are set in advance to meet the positions of recessed grooves 101d corresponding to the size of the device of the last time, then the protuberances can be brought into engagement with recessed grooves 101d as the device-positioning pedestal 100 is set to guide motion-adjusting device 200.

Figure 8:
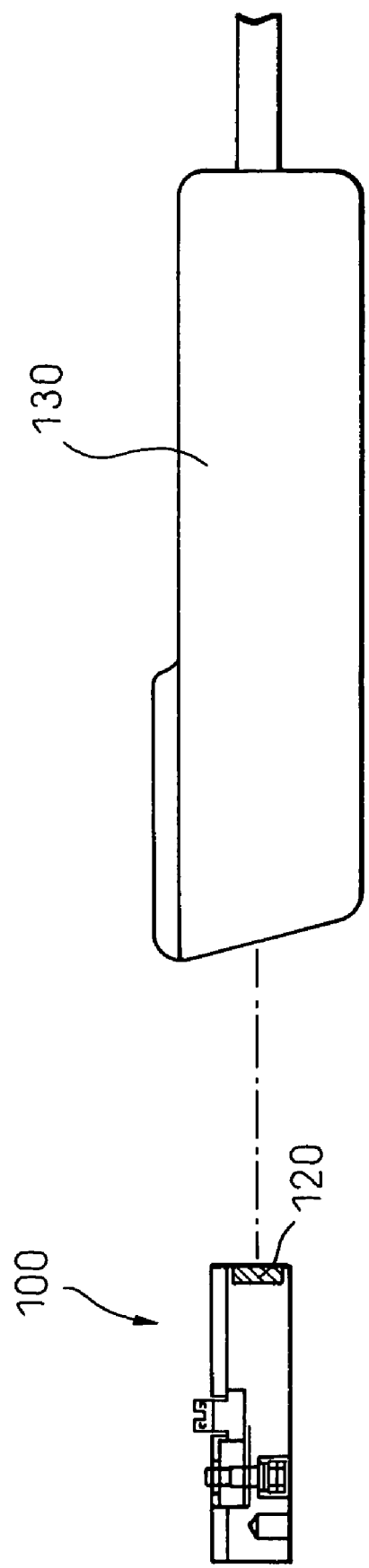
FIG. 8 is a view showing a data-recording member attached to the outer surface of the device-positioning pedestal and a data read/write device for reading the data recorded therein or for writing the data therein.

Therefore, a device data-recording member 120 is attached to a side surface of the device-positioning pedestal 100 (see FIG. 8), the data is written in advance by, for example, a data read/write device 130 (see FIG. 8), and values written into device data-recording member 120 are read out by the data read/write device 130.

Data read/write device 130 can be connected to guide motion-adjusting device 200 or is connected thereto at all times, and guide motion-adjusting device 200 calculates a gap of protuberances 203 that are to be set depending upon the size of the device that is read out, and adjusts the gap of protuberances 203 so as to assume the calculated value. The adjusting method may be effected by hand.

After protuberances 203 of guide motion-adjusting device 200 are brought into engagement with recessed grooves 101d of guide member 101 of device-positioning pedestal 100, the gap of protuberances 203 of guide motion-adjusting device 200 is varied so as to meet the size of the device of this time.

Figure 9:
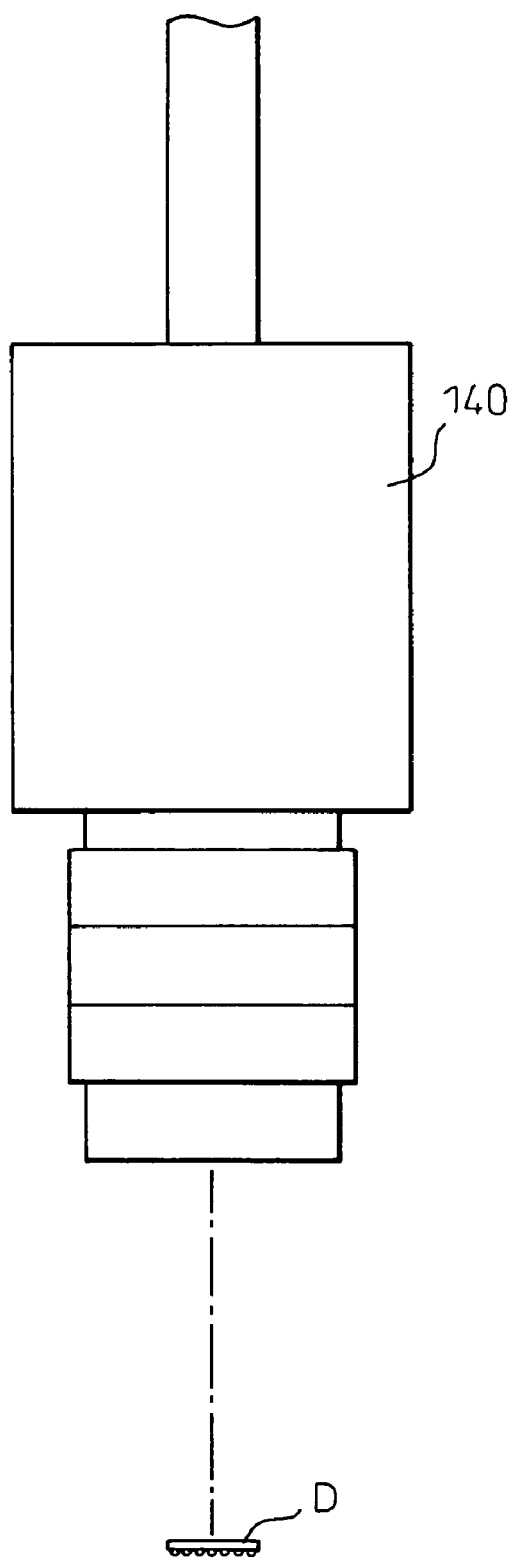
FIG. 9 is a view illustrating a manner of measuring the size of the device by using device-measuring means.

Varying means may receive the data manually or may measure the size of the device of this time by using device-measuring means 140 as shown in FIG. 9. Device-measuring means 140 can be connected to guide motion-adjusting device 200 when required or is connected thereto at all times. Guide motion-adjusting device 200 calculates the gap of protuberances 203 that are to be set depending upon the size of the device that is read out, and may adjust the gap of protuberances 203 by driving a motor 205 so as to assume the calculated value.

Device-measuring means 140 may be formed by the image processing, by an electron micro laser, or by a measurement under a predetermined load.

Device data-recording member 120 can be formed by an IC tag, an IC chip, a memory card, a magnetic card or a bar code.

Figure 7:
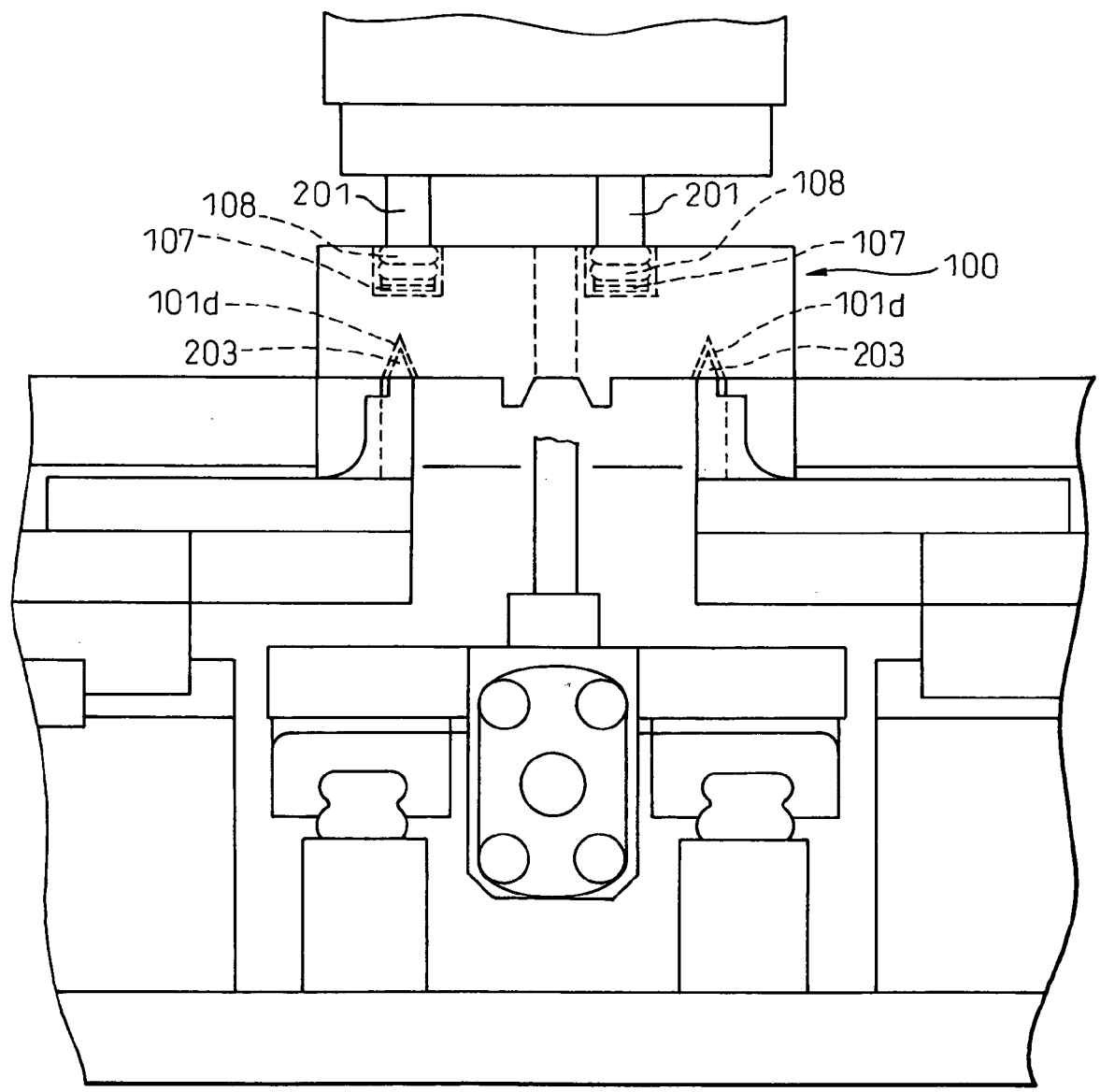
FIG. 7 is a view illustrating a major portion of FIG. 6 on an enlarged scale.

FIG. 7 is a view illustrating, on an enlarged scale, the vicinity of a portion where the protuberances 203 of FIG. 6 are engaged with recessed grooves 101d.

Protuberances 203 are moved by motors 5 via ball-and-screw mechanisms 204. In this embodiment, right and left ball-and-screw mechanisms 204 are driven by separate motors 205 to move guide members 101 supporting the two parallel sides of the device D. However, a left-handed screw may be used for one of right and left ball-and-screw mechanisms 204 and a right-handed screw may be used for the other one to drive them in synchronism by using one motor 205.

Next, described below is how to prevent a decrease in the sucking force.

The device D to be held being placed on device-positioning pedestal 100 is sucked through the hole 110 as described above. In the case of the device D of a small size as shown in FIGS. 4A and 4B, there is no gap relative to adjacent guide elements 101b, and vacuum pressure does not almost leak therethrough. However in the case of the device D of a large size as shown in FIGS. 5A and 5B, large gaps exist relative to the adjacent guide elements 101b, and the suction is not effectively attained.

Figure 10A:
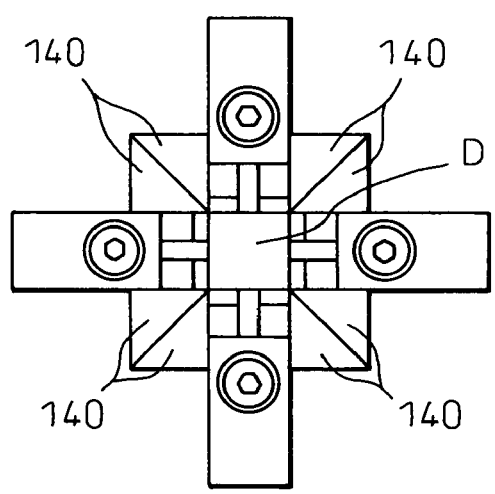
FIG. 10A is a view showing the shape of a member for preventing the decrease of sucking force of when a small device D is placed.
Figure 10B:
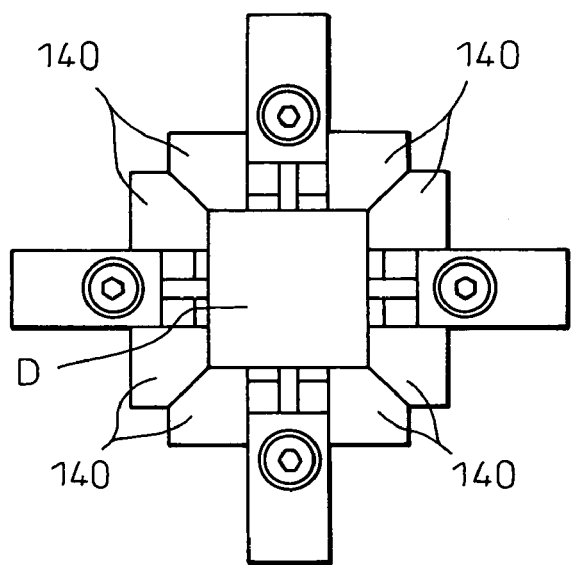
FIG. 10B is a view showing the shape of the member for preventing the decrease of sucking force of when a large device D is placed.

In this embodiment as shown in FIGS. 10A and 10B, members 140 for preventing the decrease of sucking force made of an expansible material such as a sponge are attached to both sides of each of guide elements 101b. FIG. 10A shows the shape of members 140 for preventing the decrease of sucking force of when a small device D is placed, and FIG. 10B shows the shape of members 140 for preventing the decrease of sucking force of when a large device D is placed.

In addition to being made of the expansible material as described above, member 140 for preventing the decrease of sucking force may be of the shutter-type, which coverers each gap by using one or a plurality of shutter blades.

Described below is the handler on which will be mounted device-positioning pedestal 100 that is constituted and acts as described above.

Figure 1:
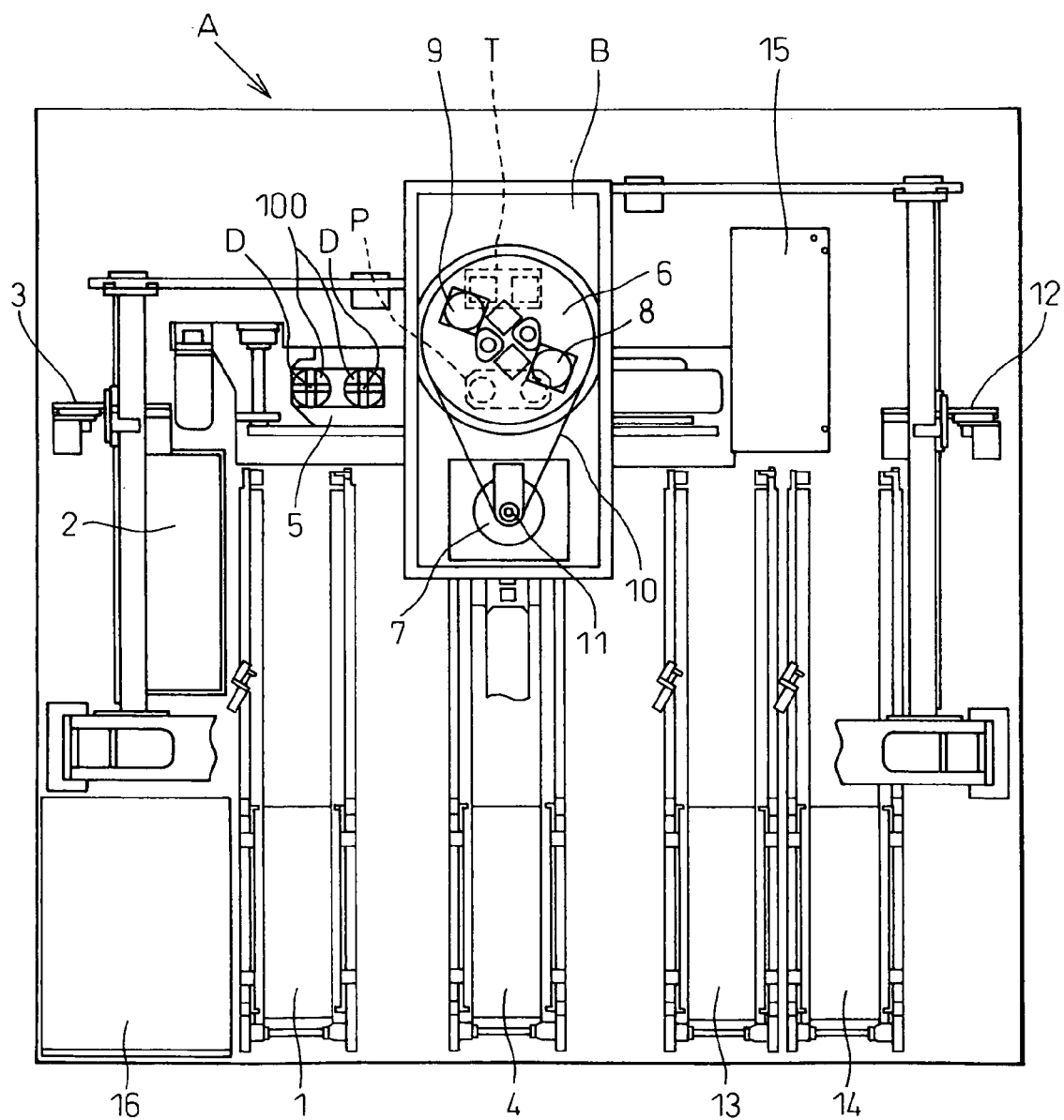
FIG. 1 is a top view of a handler including a device-positioning pedestal of the present invention.

FIG. 1 is a top view of the handler. The handler shown in FIG. 1 is of the transversely moving type in which device-positioning pedestal 100 linearly moves in the transverse direction. In addition to the handler of the transversely moving type, there is also available a handler of the swing type in which device-positioning pedestal 100 swings and moves, which is not described here. In FIG. 1, symbol A denotes a machine table, 1 denotes a loader of a charging tray, 2 denotes a preheating panel, 3 denotes a feed hand, 4 denotes a buffer of an empty tray, 5 denotes a transversely moving plate, 6 denotes a disk, 7 denotes a control motor for driving the disk, 8 and 9 denote control motors mounted on the disk 6, reference numeral 10 denotes a disk drive belt, 11 denotes a pulley of motor 7, symbol T denotes an IC socket, 12 denotes a discharge hand, 13 and 14 denote inspected product unloaders, 15 denotes a one piece-placing unloader, and 16 denotes an operation box. An electric cord connected to the IC socket T is connected to a measuring apparatus (not shown) under the table A.

The starting end of the loader 1 of the charging tray employs a magazine constitution for mounting and successively feeding the trays. Several tens or more, and depending on the cases, several hundreds or more of devices D are regularly arranged on the trays having the same outer size. The trays are successively delivered from the lower side of a stack of trays toward the upper side in FIG. 1. When sent up to a predetermined position of the loader 1, the tray is anchored. The feed hand 3 starts moving, holds a predetermined number of devices from the tray by suction force, and transfers two devices D each time onto device-positioning pedestals 100 arranged at the left ends of transversely moving plate 5. Thereafter, transversely moving plate 5 moves toward the right and stops at a predetermined position.

Figure 2:
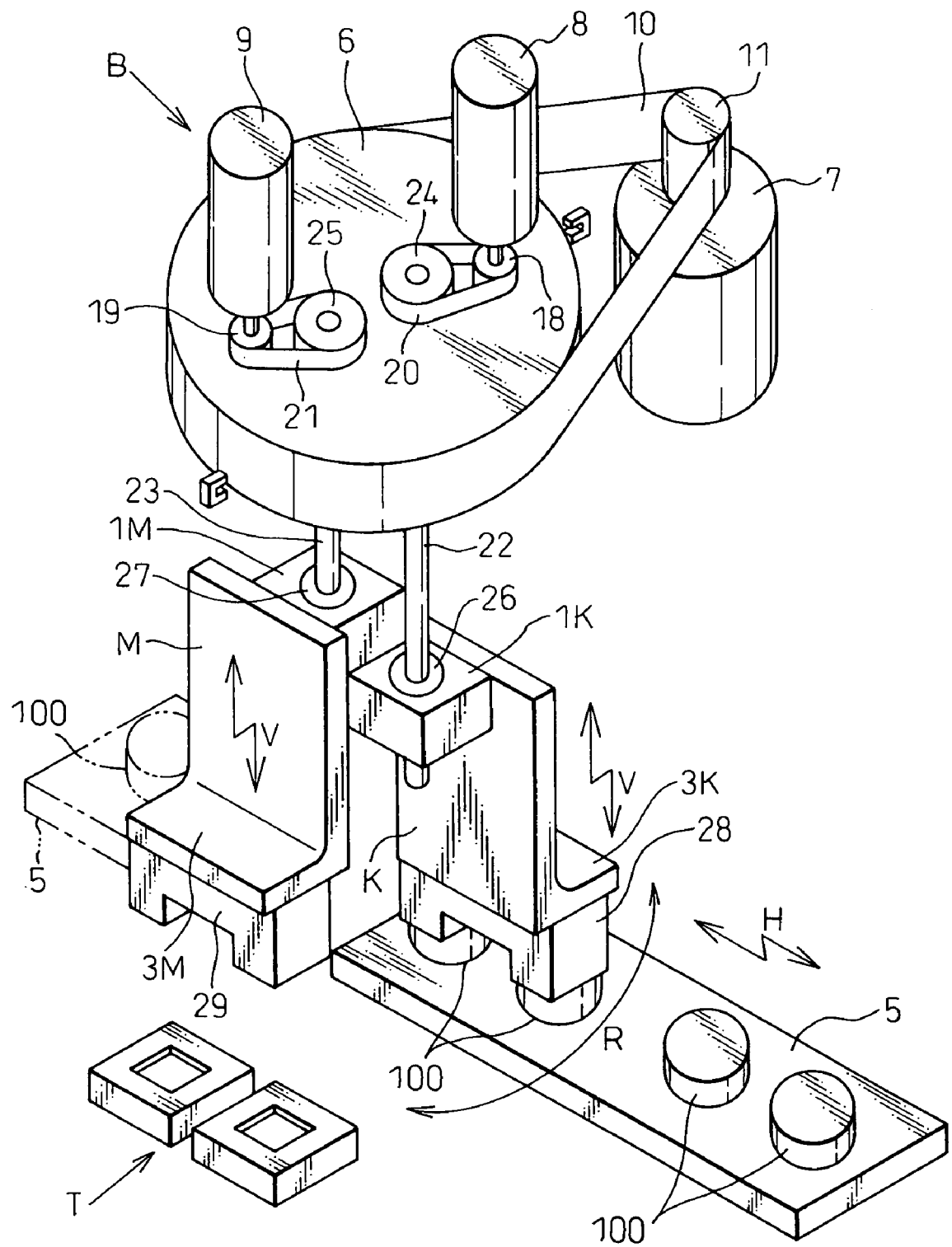
FIG. 2 is a perspective view of an inspection conveyer device in the handler of FIG. 1.

Next, the operation in the inspection conveyer device B will be described with reference to FIG. 2. Referring to FIG. 2, disk 6 is rotated forward and reverse by 180 degrees by control motor 7 for driving the disk. Adsorption pads (not shown) are provided at the lower end of cylinder case 28 on the side of a first stage under disk 6 at positions symmetrical to the center of rotation of disk 6, adsorb devices D from device-positioning pedestals 100 of transversely moving plate 5, and ascend. Thereafter, disk 6 rotates by 180 degrees to place devices D over the IC sockets T of a second stage.

Then transversely moving plate 5 moves leftward, and the feed hand 3 conveys the next device onto the device-positioning pedestal 100. The adsorption pad (not shown) provided for cylinder case 29 on the another side then adsorbs the inspected device D and is positioned over device-positioning pedestal 100 provided at the right end of transversely moving plate 5 that has moved leftward. The adsorption pad is lowered to place inspected device D on the device-positioning pedestal 100.

When transversely moving plate 5 moves rightward carrying a set of two devices, i.e., device D fed by feed hand 3 and inspected device D, discharge hand 12 is driven to pick up inspected device D from device-positioning pedestal 100 on which the inspected device D is placed. Device D has already been pushed into IC socket T to take a measurement by the measuring apparatus, and the data based on the measured value is transmitted to discharge hand 12 to instruct the destination to where inspected device D is to be discharged.

In other words, the measuring device detects the characteristics of devices D, clarifies and classifies the ranks of quality of devices D depending upon the measured results, and sorts the devices into those that can be used depending upon the object, those that are defective and cannot be used, and those that should be inspected again.

Device-positioning pedestal 100 of the present invention has guide member 101 that is movable, and can be used for devices D having different sizes. However, if it is attempted to use in the size one device-positioning pedestal 100 for too many different sized devices, stability is lost when the device of a larger size is held.

At present, for example, the smallest device may have a side of a length of about 1 mm, but the largest one will have a side of a length of as large as 50 mm. In the case of the device-positioning pedestal for positioning the device having a side of a length of about 1 mm, guide member 101 has a width for supporting the device, which is 1 mm at the greatest, and in fact is not capable of positioning a device having a side which is as large as 50 mm.

Therefore, it is recommended to provide a plurality of kinds of device-positioning pedestals 100 in accordance with the sizes of the devices. This still makes it possible to decrease number of pedestals as compared to when the device-positioning pedestals of the fixed-type are provided for each of the sizes.

The invention claimed is:

1. A device-positioning pedestal comprising;
   a plurality of guide members corresponding to sides of a device and coming in contact with the sides of the device to position the device; and
   a plurality of guide member-adjusting means formed separately from the device-positioning pedestal and used for adjusting the guide members,
   wherein at least one guide member includes a slide mechanism that supports the at least one guide member to slide relative to the device-positioning pedestal member, and a fixing mechanism that fixes the plurality of guide members at desired positions to hold devices of a plurality of sizes, wherein
   the guide members are engaged with the guide member-adjusting means by engaging means, and wherein
   after the fixing mechanism is released from a fixed state by the guide member-adjusting means, the plurality of guide members are set to be adapted to the size of the device by driving means of the guide member-adjusting means.

2. The device-positioning pedestal according to claim 1, wherein the device-positioning pedestal holds a square device, and the guide members corresponding to four sides of a square are movable.

3. The device-positioning pedestal according to claim 1, wherein the fixing mechanism includes pushing members that come in slide contact with the guide members via tilted surfaces, and wherein the guide members are pushed onto surfaces of the device-positioning pedestal member due to a wedge action of the tilted surfaces.

4. The device-positioning pedestal according to claim 1, wherein the guide member-adjusting means are configured to adjust positions of the guide members based on a size of the device measured by device size-measuring means.

5. The device-positioning pedestal according to claim 1, further comprising data-recording means, wherein data related to the device-positioning pedestal is recorded in the data-recording means by data read/write means separate from the device-positioning pedestal, wherein the data recorded in the data-recording means are sent to the guide member-adjusting means, and wherein the guide member-adjusting means adjusts the positions of the guide members based on the sent data.

6. The device-positioning pedestal according to claim 1, further comprising negative-pressure suction means separate from the device-positioning pedestal and configured to suck the device to push the device onto the guide members; and
   sucking force stabilizer means comprising an expansible material that expands and contracts depending upon the positions of the guide members, or a shutter blade that undergoes the displacement depending upon the positions of the guide members to stabilize a sucking force of the negative-pressure suction means by preventing a leakage of a negative pressure at the time of sucking.

7. The device-positioning pedestal according to claim 1, further comprising a mounting mechanism mounted on an apparatus that uses the device-positioning pedestal, the mounting mechanism being the same as the mounting mechanism of the device-positioning pedestal having guide members that do not move.

8. A handler including the device-positioning pedestal of claim 1.

9. The handler according to claim 8, wherein the guide member-adjusting means is on an inside of the handler.

* * * * *